United States Patent
Hoya et al.

(10) Patent No.: US 7,872,899 B2
(45) Date of Patent: Jan. 18, 2011

(54) SEMICONDUCTOR MEMORY DEVICE

(75) Inventors: Katsuhiko Hoya, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 783 days.

(21) Appl. No.: 11/902,873

(22) Filed: Sep. 26, 2007

(65) Prior Publication Data
US 2008/0084730 A1    Apr. 10, 2008

(30) Foreign Application Priority Data
Sep. 28, 2006  (JP) .............................. 2006-263797

(51) Int. Cl.
*G11C 11/22*   (2006.01)
(52) U.S. Cl. ................... 365/145; 365/65; 257/E21.664
(58) Field of Classification Search .............. 365/49.13, 365/65, 109, 117, 145; 257/295, E21.208, 257/E21.663, E21.664, E27.104, E29.164
See application file for complete search history.

(56) References Cited

U.S. PATENT DOCUMENTS

| | | | | |
|---|---|---|---|---|
| 5,943,256 | A * | 8/1999 | Shimizu et al. ............. | 365/145 |
| 6,356,475 | B1 * | 3/2002 | Tamura et al. .............. | 365/145 |
| 6,510,071 | B2 | 1/2003 | Oowaki | |
| 6,522,569 | B2 * | 2/2003 | Miyakawa et al. .......... | 365/145 |
| 6,600,674 | B2 | 7/2003 | Kasai | |
| 7,123,501 | B2 * | 10/2006 | Noda .......................... | 365/145 |
| 2002/0034091 | A1 * | 3/2002 | Miyakawa et al. .......... | 365/145 |
| 2005/0094476 | A1 * | 5/2005 | Noda .......................... | 365/232 |
| 2007/0008765 | A1 * | 1/2007 | Takashima .................. | 365/145 |
| 2007/0236980 | A1 * | 10/2007 | Takashima .................. | 365/145 |

FOREIGN PATENT DOCUMENTS

| | | |
|---|---|---|
| JP | 2001-250376 | 9/2001 |
| JP | 2005-175311 | 6/2005 |

* cited by examiner

*Primary Examiner*—Richard Elms
*Assistant Examiner*—Harry W Byrne
(74) *Attorney, Agent, or Firm*—Finnegan, Henderson, Farabow, Garrett & Dunner, L.L.P.

(57) ABSTRACT

The memory cell array includes a memory cell, the memory cell including a ferroelectric capacitor and a transistor. The memory cell array includes a word line selecting the memory cell, a plate line applying a drive voltage to the ferroelectric capacitor, and a bit line reading data from the ferroelectric capacitor. A selection transistor selectively connects the memory cell to the bit line. A dummy cell provides a reference potential, the reference potential being referred to for a potential read from the memory cell. A sense amplifier circuit includes a plurality of amplification circuits amplifying the potential difference between a bit-line pair. A decoupling circuit electrically cuts off the bit line between the amplification circuits.

16 Claims, 13 Drawing Sheets

SEMICONDUCTOR MEMORY DEVICE

CROSS REFERENCE TO RELATED APPLICATIONS

This application is based on and claims the benefit of priority from prior Japanese Patent Application No. 2006-263797, filed on Sep. 28, 2006 the entire contents of which are incorporated herein by reference.

BACKGROUND OF THE INVENTION

1. Field of the Invention

The present invention relates to a semiconductor memory device, and more particularly, to a ferroelectric memory device including a memory cell that includes a ferroelectric capacitor and a transistor.

2. Description of the Related Art

The ferroelectric memory (FeRAM) is a semiconductor memory device that uses the hysteresis characteristics of the ferroelectric capacitor to allow for binary data storage in a non-volatile manner using the two different polarization strengths of the ferroelectric substance. The memory cell of the conventional ferroelectric memory generally adopts a similar architecture to the DRAM. The cell replaces the dielectric capacitor with the ferroelectric capacitor, providing a set of the ferroelectric capacitor and the transistor connected in series (see, for example, JP 2001-250376). A plurality of the sets form the memory cell array.

There are two schemes of reading data from the ferroelectric memory: a two transistor/two cell scheme (2T2C scheme) that reads 1-bit data from two memory cells and a one transistor/one cell scheme (1T1C scheme) that reads 1-bit data from one memory cell.

The 1T1C scheme selects a word line of the cell to be read, and renders the selection transistor conductive, thereby connecting the memory cell and a bit line. A plate voltage is then applied to a plate line connected to the memory cell, and a voltage is applied across the ferroelectric capacitor included in the memory cell. The charge is read from the ferroelectric capacitor to the bit line. The bit line forms a bit-line pair with another bit line (complementary bit line). The complementary bit line is applied with a reference potential from a reference-potential generation circuit.

A sense amplifier amplifies the difference between the bit-line pair potentials. The difference of the charge read to the bit-line pair provides a signal. The signal depends largely on the ratio of the bit-line capacitance Cb and the ferroelectric-capacitor capacitance Cs. Unfortunately, as the memory cells become smaller, the bit-line capacitance generally increases, thus reading a smaller signal to the bit-line pair and decreasing the operation margin. The sense amplifier capacitance Csa has not been as much improved as the memory cells become smaller. The capacitance Csa thus generally has relatively more effect on the read-signal amplitude and the read-operation margin as the memory cells become smaller.

SUMMARY OF THE INVENTION

A semiconductor memory device according to an aspect of the present invention comprises: a memory cell array with memory cells arranged therein, the memory cell including a ferroelectric capacitor and a transistor, a word line selecting the memory cell, a plate line applying a drive voltage to the ferroelectric capacitor, and a bit line reading data from the ferroelectric capacitor in the memory cell, a selection transistor selectively connecting the bit line to the memory cell; a dummy cell providing a reference potential to a complementary bit line forming a bit-line pair with the bit line, the reference potential being referred to for a potential read from the memory cell; a sense amplifier circuit comprising a plurality of amplification circuits amplifying a potential difference between the bit-line pair; and a decoupling circuit electrically cutting off the bit line between the amplification circuits.

DETAILED DESCRIPTION OF THE EMBODIMENTS

With reference to the accompanying drawings, preferred embodiments of the present invention are described in more detail below.

First Embodiment

Figure 1:
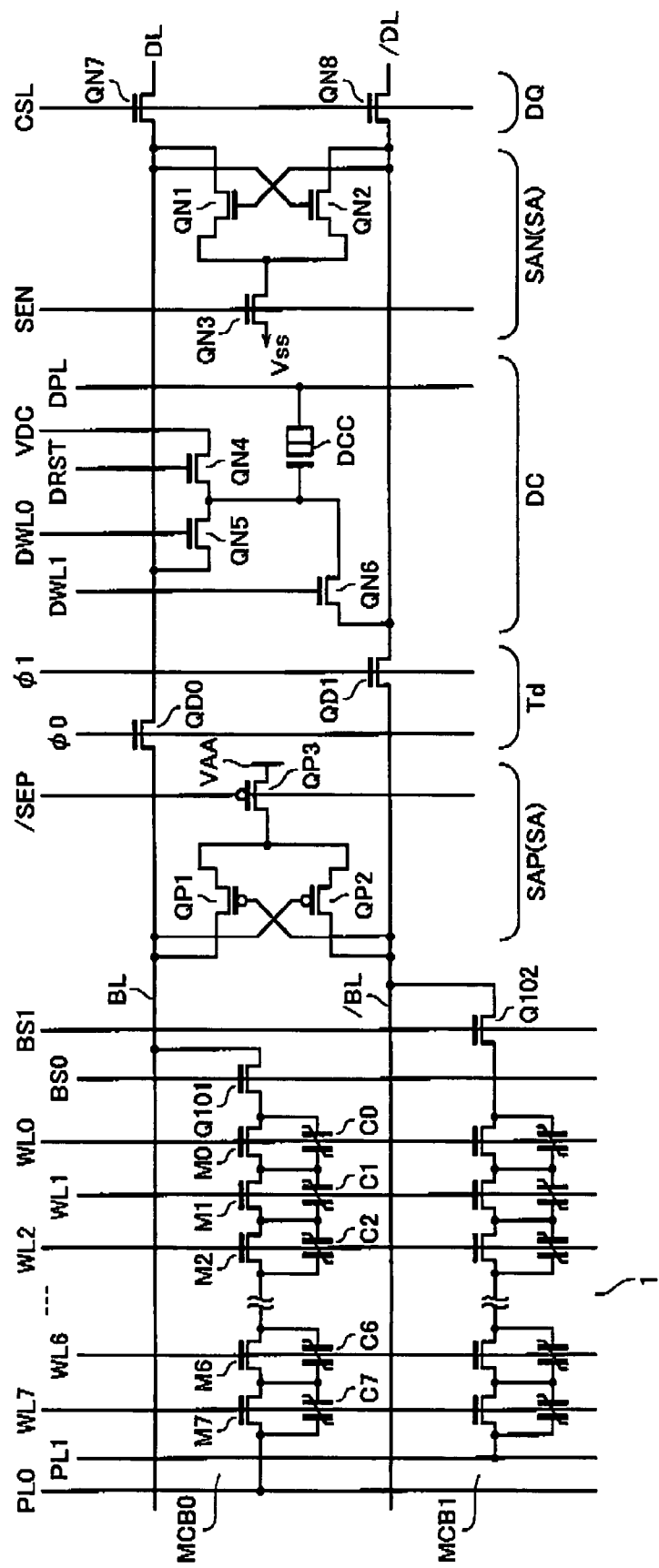
FIG. 1 shows a circuit diagram of a ferroelectric memory according to a first embodiment of the present invention.

FIG. 1 shows a circuit diagram of a ferroelectric memory according to a first embodiment of the present invention. This embodiment provides a type of ferroelectric memory (TC parallel unit series-connected FeRAM). A memory cell array 1 includes memory cell blocks MCB0, MCB1 . . . . Each memory cell block includes a plurality of memory cells (eight memory cells in FIG. 1) connected in series. Each memory cell includes a parallel-connected n-type MOS transistor Mi (i=0 to 7) and a ferroelectric capacitor Ci (i=0 to 7). FIG. 1 shows two memory-cell blocks MCB0 and MCB1 connected to the bit-line pair BL and /BL, respectively.

The memory cell blocks MCB0 and MCB1 each have at their one ends the ferroelectric capacitors C7. The capacitors C7 have plate electrodes connected to plate lines PL0 and PL1, respectively, that apply drive voltages. The memory cell blocks MCB0 and MCB1 have the other ends connected, via the selection transistors Q101 and Q102, to the bit lines BL and /BL, respectively. The selection transistors Q101 and Q102 are turned on/off by block selection signals BS0 and BS1, respectively.

The memory cell blocks MCB0 and MCB1 hold, on standby, all word lines Wli (i=0 to 7) at "H", thereby applying no voltage to all ferroelectric capacitors Ci. When, for example, the word line WL0 is only brought to "L" to read data, a voltage is applied across the ferroelectric capacitor C0, thereby providing a voltage to the bit line BL or /BL depending on the cell data held in the ferroelectric capacitor C0. Data is thus read.

The bit lines BL and /BL form a bit-line pair that compares the read potential from the memory cell and a reference potential read from a dummy cell described below. When, specifically, one of the bit lines BL and /BL has the read potential, the other becomes a complementary bit line that has the reference potential. The reference potential is set to a midpoint potential (generally ½) between the read potential when "0" data is read and the read potential when "1" data is read. For the chain-type ferroelectric memory in FIG. 1, one of the block selection signals BS0 and BS1 may be changed to "H," thereby connecting only one of the memory cell blocks MCB0 and MCB1 to the bit line BL or /BL.

The reference potential is generated by the dummy cell DC. The dummy cell DC includes an reset transistor QN4, selection transistors QN5 and QN6, and a dummy capacitor DCC. The selection transistor QN5 is connected between the bit line BL and one end of the dummy capacitor DCC. The selection transistor QN6 is connected between the bit line /BL and the one end of the dummy capacitor DCC.

The dummy capacitor DCC has the other end applied with a dummy plate potential DPL. The selection transistors QN5 and QN6 have their gates to which dummy word lines DWL0 and DWL1 are connected, respectively. The reset transistor QN4 has one end connected to the one end of the dummy capacitor DCC. The transistor QN4 has the other end applied with a reference potential VDC. The one end of the dummy capacitor DCC is thus reset to the reference potential VDC by a reset signal DRST. The dummy word line DWL0 or DWL1 is selectively brought to "H" depending on whether the selection transistor Q101 or Q102 is rendered conductive.

Specifically, when the selection transistor Q101 is rendered conductive to connect the memory cell block MCB0 to the bit line BL, the dummy word line DWL1 is brought to "H," thereby generating the reference potential in the bit line /BL that acts as the complementary bit line. When, conversely, the selection transistor Q102 is rendered conductive to connect the memory cell block MCB1 to the bit line /BL, the dummy word line DWL0 is brought to "H," thereby generating the reference potential in the bit line BL that acts as the complementary bit line.

The bit-line pair BL and /BL have between them a sense amplifier SA. The amplifier SA compares data in the memory cell Mi with the reference potential, amplifies the comparison, and holds the amplified result. The sense amplifier SA includes a p-type sense amplifier SAP and an n-type sense amplifier SAN. The p-type sense amplifier SAP includes p-type MOS transistors QP1 to QP3. The n-type sense amplifier SAN includes n-type MOS transistors QN1 to QN3. The p-type and n-type sense amplifiers SAP and SAN operate as controlled by the sense-amplifier enable signals SEN and /SEP, respectively.

The p-type sense amplifier SAP includes the p-type MOS transistors QP1 and QP2. The transistors QP1 and QP2 are connected in series between the bit-line pair BL and /BL. The QP1 and QP2 have their gates cross-connected to the bit-line pair /BL and BL, respectively, to form a flip-flop circuit.

The transistors QP1 and QP2 have between them a common connection point. The common connection point and the power supply voltage VAA have between them a p-type MOS transistor QP3 connected. The transistor QP3 has its gate supplied with a sense-amplifier enable signal /SEP, thereby controlling on/off of the p-type sense amplifier SAP.

The n-type sense amplifier SAN includes the n-type MOS transistors QN1 and QN2. The transistors QN1 and QN2 are connected in series between the bit-line pair BL and /BL. The QN1 and QN2 have their gates cross-connected to the bit-line pair /BL and BL, respectively, to form a flip-flop circuit.

The transistors QN1 and QN2 have between them a common connection point. An n-type MOS transistor QN3 is connected between the common connection point and the ground potential Vss. The transistor QN3 has its gate supplied with a sense-amplifier enable signal SEN, thereby controlling on/off of the n-type sense amplifier SAN. The bit-line pair BL and /BL includes a decoupling circuit Td to electrically cut off the bit lines BL and /BL. The decoupling circuit Td includes decoupling transistors QD0 and QD1 in the bit lines BL and /BL, respectively.

The decoupling transistors QD0 and QD1 are, for example, n-type MOS transistors as shown in FIG. 1. Gate signals $\phi 0$ and $\phi 1$ are sent to the transistors QD0 and QD1, respectively. The signal $\phi 0$ or $\phi 1$ is changed to "L," thereby electrically cutting off the bit line BL or /BL, respectively. The bit-line capacitance is thus reduced when reading data. Note that in this embodiment, the gate signals $\phi 0$ and $\phi 1$ switch logic at different timings at the start of reading data from the memory cell. One of the decoupling transistor is selectively connected to the memory cell via the bit line and the other is not. The gate signal to the transistor connected to the memory cell switches from "L" to "H" later than the other signal.

In this embodiment, the decoupling circuit Td and the memory cell array 1 have between them only the p-type sense amplifier SAP. Also in this embodiment, the n-type sense amplifier SAN and the dummy cell DC reside on farther side than the decoupling circuit Td when seen from the memory cell array 1. In other words, the decoupling circuit Td resides between the two sense amplifiers SAP and SAN included in the sense amplifier circuit SA. Immediately after data is read from the memory cell array 1, the decoupling transistor QD0 in the decoupling circuit Td is rendered non-conductive. The bit-line capacitance Cb may thus be reduced when the p-type sense amplifier SAP senses data.

Connected between the bit lines BL and /BL and the data lines DL and /DL is a data-line control circuit DQ. After the sense amplifier circuit SA amplifies the potential difference, the n-type MOS transistors QN7 and QN8 in the data-line control circuit DQ turn on. The read data is thus output to the data lines DL and /DL.

Figure 2:
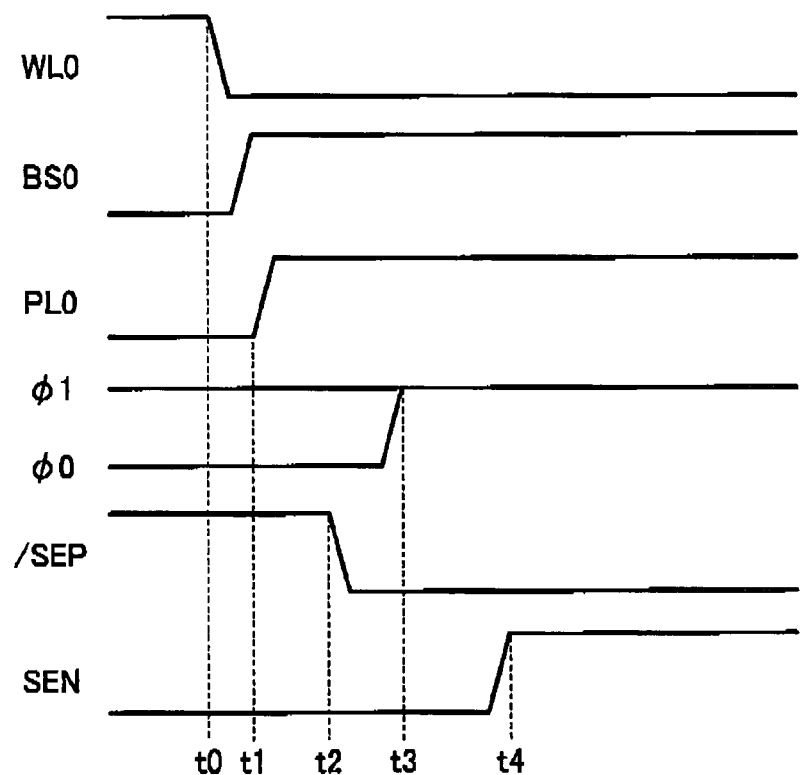
FIG. 2 shows a timing chart of an operation of a ferroelectric memory according to a first embodiment of the present invention.

Referring to the timing chart in FIG. 2, the operation of the ferroelectric memory in this embodiment is described below. When reading data, a cell to be read such as the cell of the ferroelectric capacitor C0 in the memory cell block MCB0 is selected by changing the word line WL0 to "L" at time to. The block selection signal BS0 to the selection transistor Q101 is then changed to "H," thereby connecting the memory cell block MCB0 and the bit line BL. Then at time t1, the plate line PL0 connected to the memory cell block MCB0 is changed from Vss to VAA (voltage applied to the capacitor).

The voltage VAA is thus applied across the ferroelectric capacitor C0 in the cell to be read. The charge is then read from the ferroelectric capacitor C0 to the bit line BL. The decoupling transistor QD0 in the decoupling circuit Td in the bit line BL is rendered non-conductive by keeping the gate signal φ0 "L." The bit line BL is thus electrically cut off at the decoupling transistor QD0, reducing the bit-line capacitance Cb of the bit line BL.

The bit line /BL acts as a complementary bit line forming a bit-line pair with the bit line BL. The bit line /BL is applied with the reference potential from the dummy cell DC. The gate signal φ1 remains "H" since data read starts (t=0).

At time t2, the sense-amplifier enable signal /SEP is switched from "H" to "L." The p-type sense amplifier SAP is thus activated to amplify the potential difference between the bit lines BL and /BL. The gate signal φ0 remains "L," as described above, thereby keeping the decoupling transistor QD0 off. The bit line BL is thus electrically cut off at the transistor QD0, thereby reducing the bit-line capacitance Cb of the bit line BL.

Then at time t3, the gate signal φ0 is switched from "L" to "H," rendering the decoupling transistor QD0 conductive. The n-type sense amplifier SAN and the bit line BL are thus connected. Then at time t4, the sense-amplifier enable signal SEN is changed to "H." The n-type sense amplifier SAN is thus activated to amplify the potential difference. In this embodiment, the decoupling transistor QD0 is rendered non-conductive, thereby reducing the bit-line capacitance Cb of the bit line BL when the p-type sense amplifier SAP amplifies the potential difference. The decoupling transistor QD0 is then rendered conductive, and the n-type sense amplifier SAN amplifies the potential difference. The decoupling circuit Td and the memory cell array 1 have between them a portion of the sense amplifier circuit SA i.e., the p-type sense amplifier SAP. The bit-line capacitance Cb may thus be reduced when the potential difference is amplified. In this way, the bit-line capacitance Cb and the sense amplifier capacitance Csa may be reduced, thereby increasing the read margin.

Thus, the invention has been described with respect to reading the memory cell in the memory cell block MCB0. When, however, the memory cell in the memory cell block MCB1 is read, the gate signal φ0 to the decoupling transistor QD0 remains "H," in contrast to the time chart in FIG. 2, while the gate signal φ1 to the decoupling transistor QD1 is raised later from "L" to "H". Other operations are similar to those as described above. Specifically, in the decoupling circuit Td, the decoupling transistor in the bit line where the read potential from the memory cell occurs remains "L" until the p-type sense amplifier SAP ends the amplification of the potential difference, thereby reducing the bit-line capacitance of that bit line.

Second Embodiment

Figure 3:
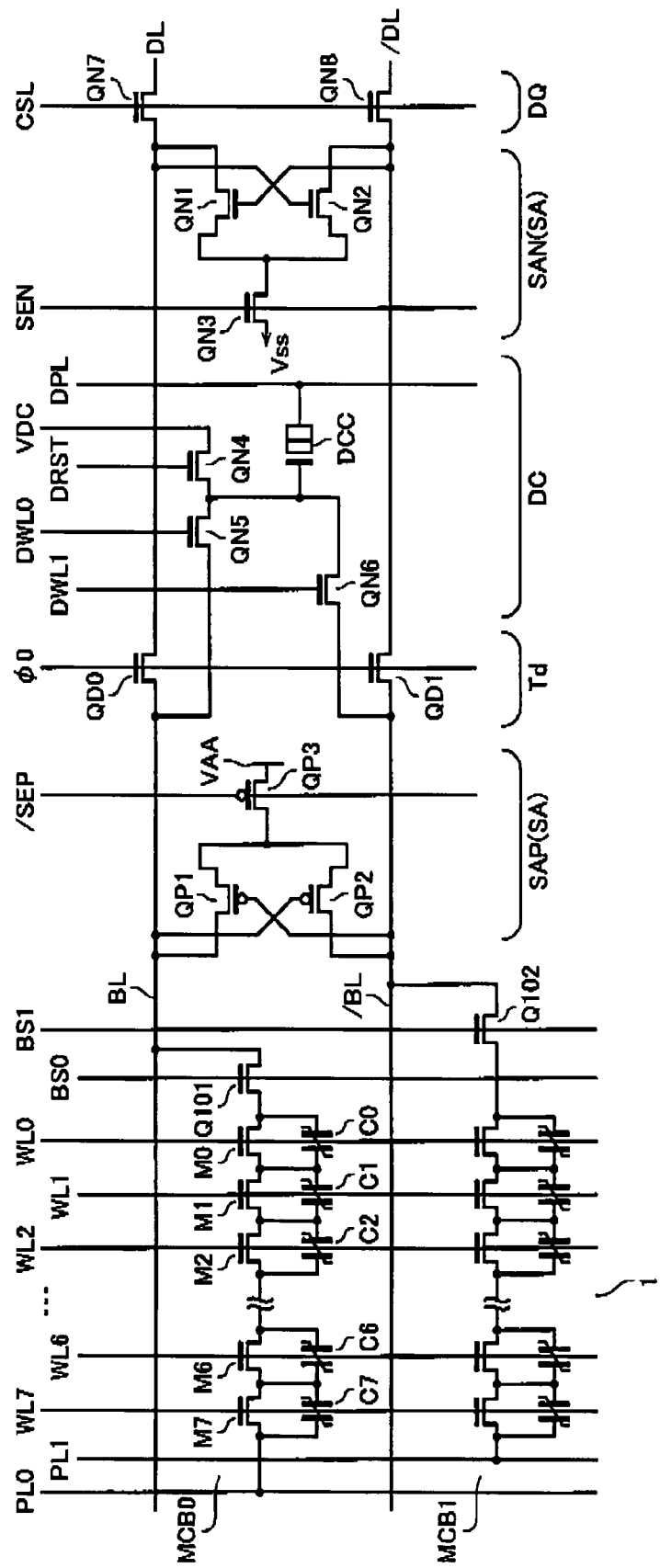
FIG. 3 shows a circuit diagram of a ferroelectric memory according to a second embodiment of the present invention.

FIG. 3 shows a configuration of a ferroelectric capacitor according to a second embodiment of the present invention. In FIG. 3, like elements as those in the first embodiment are designated by like reference numerals as those in FIG. 1, and their detailed description is omitted below.

This embodiment differs from the first embodiment in that the output terminals (specifically, one ends of the selection transistors QN5 and QN6) of the dummy cell DC are connected to the bit lines BL and /BL on the nearer side than the decoupling circuit Td when seen from the memory cell array 1, i.e., between the p-type sense amplifier SAP and the decoupling circuit Td. This embodiment also differs from the first embodiment in that the decoupling transistors QD0 and QD1 in the decoupling circuit Td are turned on/off by the same gate signal φ0 at the same time.

Figure 4:
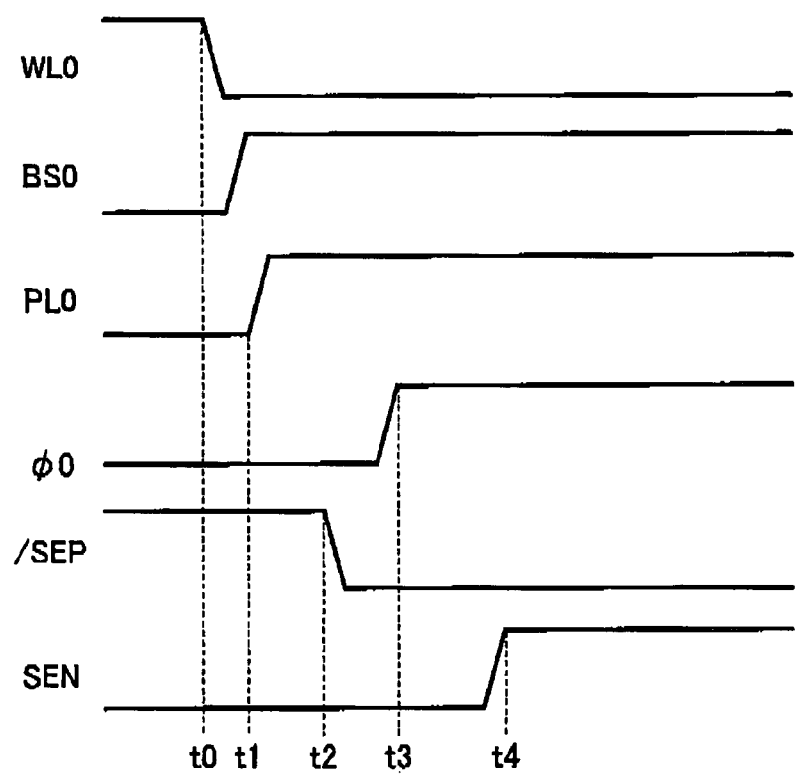
FIG. 4 shows a timing chart of an operation of a ferroelectric memory according to a second embodiment of the present invention.

Referring to the timing chart in FIG. 4, the operation of the ferroelectric memory (FIG. 3) in the second embodiment is described below. When, for example, the cell of the ferroelectric capacitor C0 in the memory cell block MCB0 is read, the word line WLi, the block selection signal BS0, the plate line PLi, the sense-amplifier enable signals /SEP and SEN operate in a similar way to the first embodiment.

Note, however, that this embodiment differs from the first embodiment (FIG. 2) in that the sense-amplifier enable signal /SEP changes from "H" to "L" at time t2, the p-type sense amplifier SAP ends the amplification of the potential difference, and then the gate signal φ0 changes from "L" to "H" at time t3. In this embodiment, as described above, the output terminals of the dummy cell DC reside between the memory cell array 1 and the decoupling transistors QD0 and QD1. When, therefore, reading data is started, i.e., the p-type sense amplifier SAP amplifies the potential difference, the complementary bit line (here, the bit line /BL) may be electrically cut off at the decoupling circuit Td without any problems. If anything, such cutting off may be suitable because it may reduce the bit-line capacitance Cb. After the p-type sense amplifier SAP ends the amplification of the potential difference, the gate signal φ0 switches from "L" to "H" at time t3. The sense-amplifier enable signal SEN then switches from "L" to "H" at time t4. The n-type sense amplifier SAN thus amplifies the potential difference as in the first embodiment.

Third Embodiment

Figure 5:
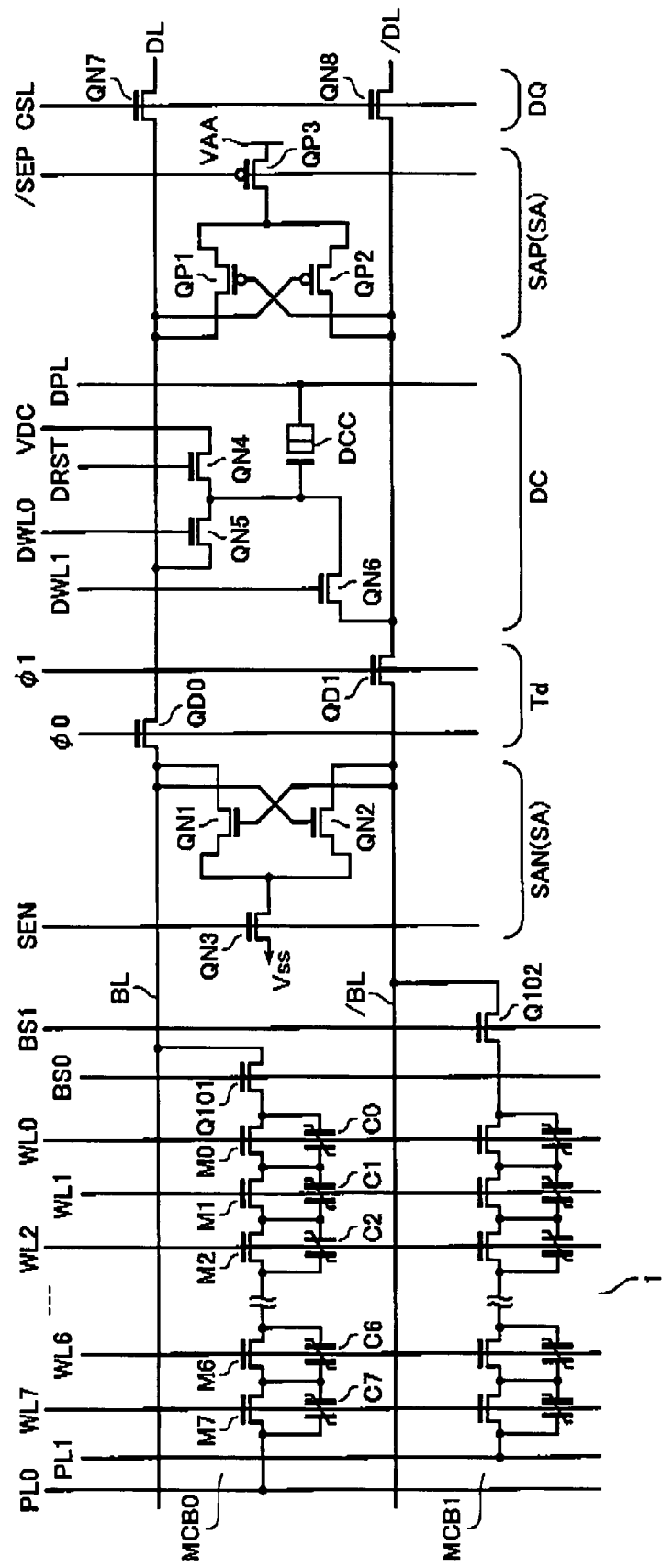
FIG. 5 shows a circuit diagram of a ferroelectric memory according to a third embodiment of the present invention.

FIG. 5 shows a configuration of a ferroelectric capacitor according to a third embodiment of the present invention. In FIG. 5, like elements as those in the first embodiment are designated by like reference numerals as those in FIG. 1, and their detailed description is omitted below. In this embodiment, the p-type sense amplifier SAP and the n-type sense amplifier SAN are on the opposite side compared to those in the above embodiments. Specifically, the n-type sense amplifier SAN resides between the decoupling circuit Td and the memory cell array 1, while the p-type sense amplifier SAP resides on the farther side than the decoupling circuit Td when seen from the memory cell array 1, i.e., between the dummy cell DC and the data-line control circuit DQ.

Figure 6:
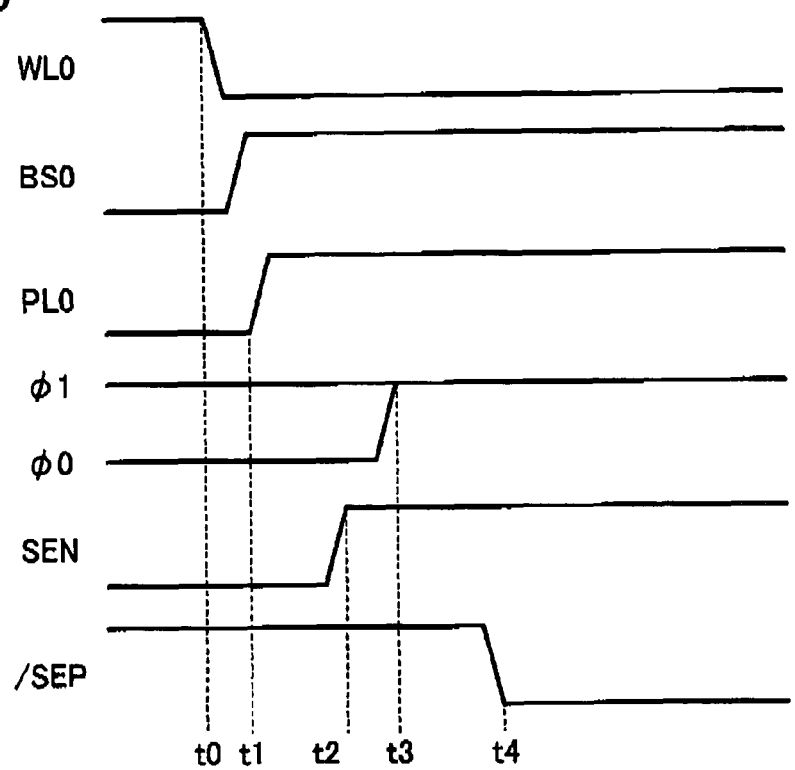
FIG. 6 shows a timing chart of an operation of a ferroelectric memory according to a third embodiment of the present invention.

Referring to the timing chart in FIG. 6, the operation of the ferroelectric capacitor in this embodiment is described below. When, for example, the cell of the ferroelectric capacitor C0 in the memory cell block MCB0 is read, the word line WLi, the block selection signal BS0, the plate line PLi, the sense-amplifier enable signals /SEP and SEN operate in a similar way to the first embodiment. Note, however, that in this embodiment, the n-type sense amplifier SAN resides between the decoupling circuit Td and the memory cell array 1, and so the sense-amplifier enable signal SEN switches earlier from "L" to "H" at time t2 to allow the n-type sense amplifier SAN to operate. Then at time t3, the gate signal φ0 switches from "L" to "H." Then at time t4, the sense-amplifier enable signal /SAP switches from "H" to "L" to allow the p-type sense amplifier SAP to operate.

Fourth Embodiment

Figure 7:
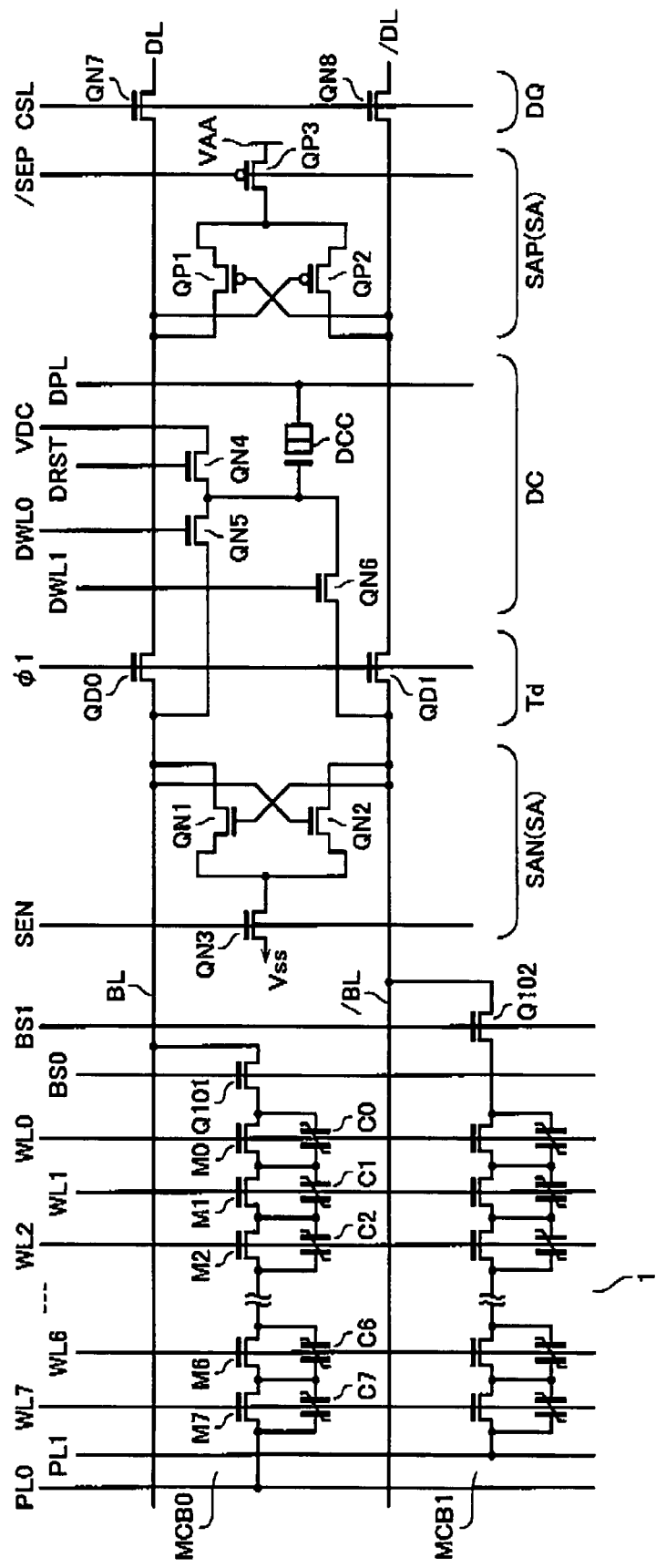
FIG. 7 shows a circuit diagram of a ferroelectric memory according to a fourth embodiment of the present invention.

FIG. 7 shows a configuration of a ferroelectric capacitor according to a fourth embodiment of the present invention. In FIG. 7, like elements as those in the first embodiment are designated by like reference numerals as those in FIG. 1, and their detailed description is omitted below. In this embodiment, as in the third embodiment, the p-type sense amplifier SAP and the n-type sense amplifier SAN are on the opposite side compared to those in the first embodiment. This embodiment differs from the first embodiment in that, as in the second embodiment, the output terminal of the dummy cell DC is connected to the bit lines BL and /BL between the decoupling circuit Td and the memory cell array 1.

Figure 8:
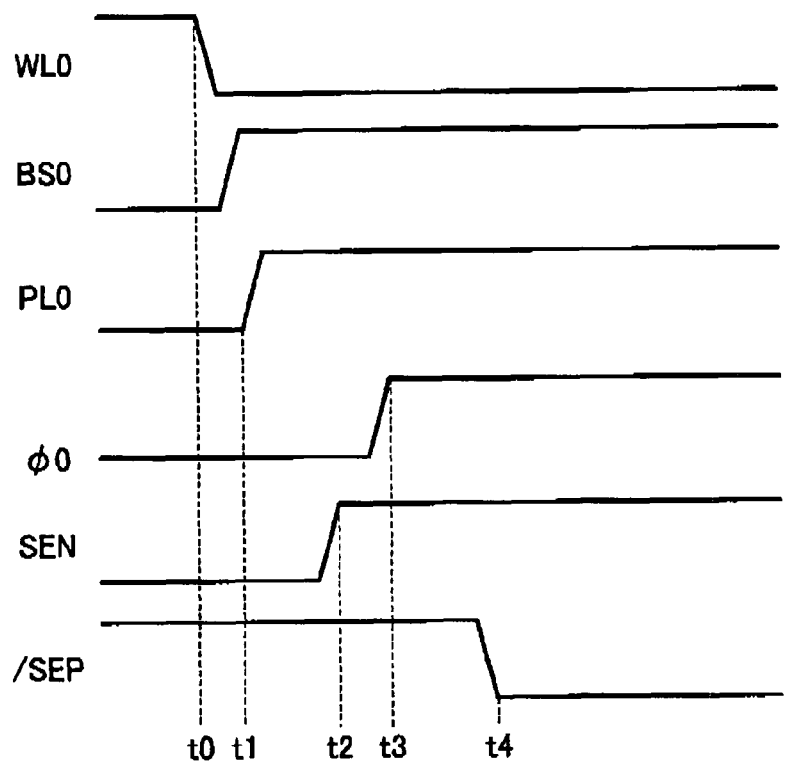
FIG. 8 shows a timing chart of an operation of a ferroelectric memory according to a fourth embodiment of the present invention.

FIG. 8 is a timing chart illustrating the operation of the ferroelectric capacitor in this embodiment. The fourth embodiment is similar to the third embodiment except that the decoupling transistors QD0 and QD1 are rendered conductive at the same time by the gate signal φ0.

Fifth Embodiment

Figure 9:
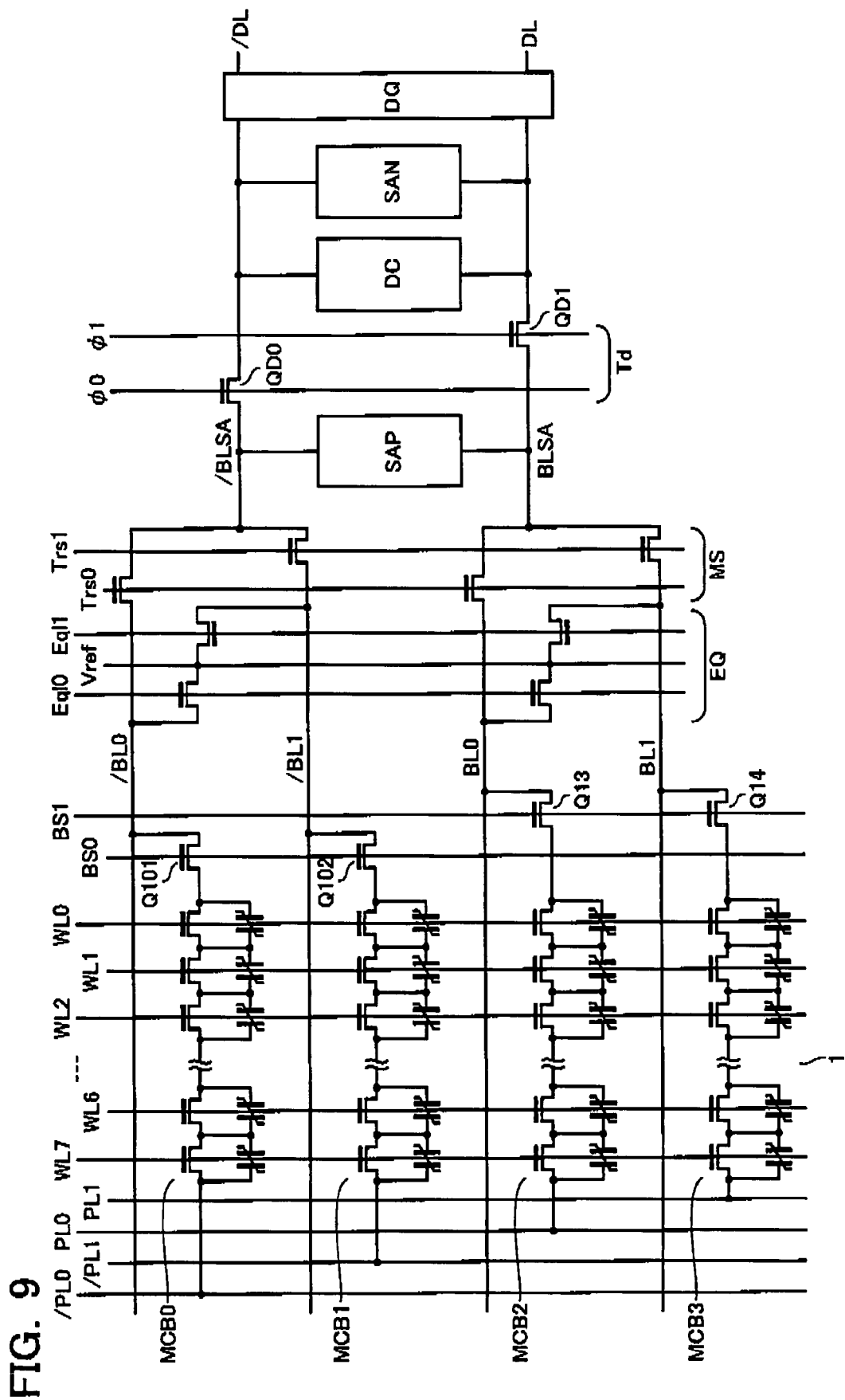
FIG. 9 shows a circuit diagram of a ferroelectric memory according to a fifth embodiment of the present invention.

FIG. 9 shows a configuration of a ferroelectric capacitor according to a fifth embodiment of the present invention. In FIG. 9, like elements as those in the first embodiment are designated by like reference numerals as those in FIG. 1, and their detailed description is omitted below. In FIG. 9, the sense amplifiers SAP and SAN, the dummy cell DC, and the data-line control circuit DQ are shown in a block diagram. Their configuration details may, however, be similar to those in the above embodiments.

This embodiment differs from the above embodiments in that two bit lines /BL0 and /BL1 are connectable to one bit line /BLSA and one of them is selectable by the multiplexer circuit MS. The bit lines /BL0 and /BL1 have the memory cell blocks MCB0 and MCB1 connected thereto via the selection transistors Q101 and Q102, respectively.

Depending on whether the memory cell block MCB0 or MCB1 is selected, the selection signal Trs0 or Trs1 from the multiplexer circuit MS is selectively switched from "L" to "H" to select the bit line /BL0 or /BL1. Similarly, two bit lines BL0 and BL1 are connectable to one bit line BLSA and one of them is selectable by the multiplexer circuit MS. The bit lines BL0 and BL1 have the memory cell blocks MCB2 and MCB3 connected thereto via the selection transistors Q103 and Q104, respectively. The potentials of the selected bit lines /BL0, /BL1, BL0, and BL1 are equalized by an equalizer circuit EQ before data reading. Depending on the selected bit line, the equalization signals Eq10 and Eq11 are switched, thereby equalizing the selected bit line to the reference potential Vref. Note that in the fifth embodiment, the sense amplifiers SAP and SAN, the decoupling circuit Td, and the dummy cell DC are arranged in a similar way to those in the first embodiment, and so they operate generally as shown in FIG. 2.

Sixth Embodiment

Figure 10:
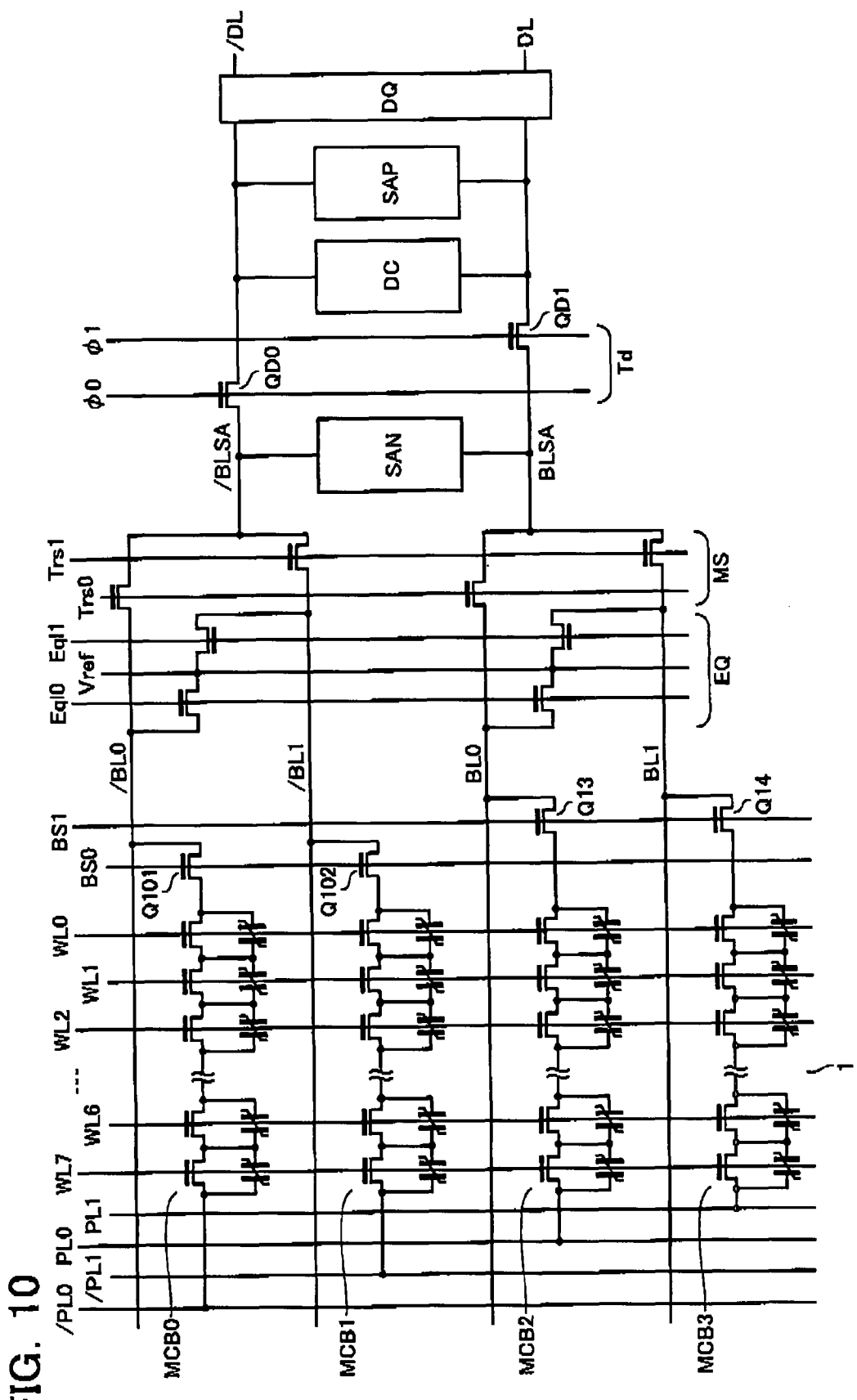
FIG. 10 shows a circuit diagram of a ferroelectric memory according to a sixth embodiment of the present invention.

FIG. 10 shows a configuration of a ferroelectric capacitor according to a sixth embodiment the present invention. Also in this embodiment, the two bit lines /BL0 and /BL1 (BL0 and BL1) are connectable to the one bit line /BLSA (BLSA), and one of them is selectable by the multiplexer circuit MS. This embodiment is similar to the fifth embodiment except that the sense amplifiers SAP and SAN, the dummy cell DC, and the data-line control circuit DQ are arranged in a similar order to those in the third embodiment.

Seventh Embodiment

Figure 11:
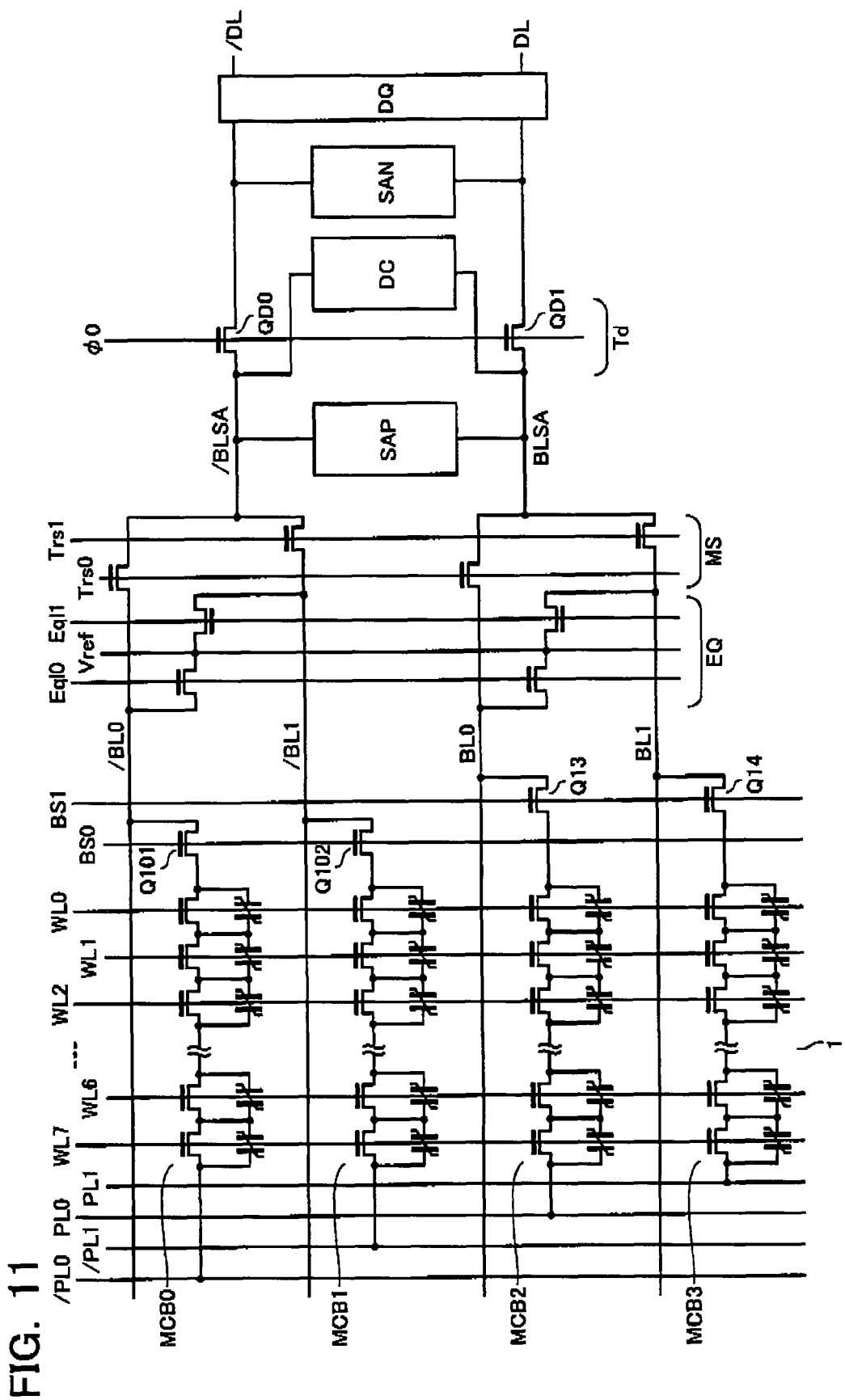
FIG. 11 shows a circuit diagram of a ferroelectric memory according to a seventh embodiment of the present invention.

FIG. 11 shows a configuration of a ferroelectric capacitor according to a seventh embodiment of the present invention. Also in this embodiment, the two bit lines /BL0 and /BL1 (BL0 and BL1) are connectable to the one bit line /BLSA (BLSA), and one of them is selectable by the multiplexer circuit MS. This embodiment is similar to the fifth embodiment except that the sense amplifiers SAP and SAN, the dummy cell DC, and the data-line control circuit DQ are arranged in an order similar to those in the second embodiment.

Eighth Embodiment

Figure 12:
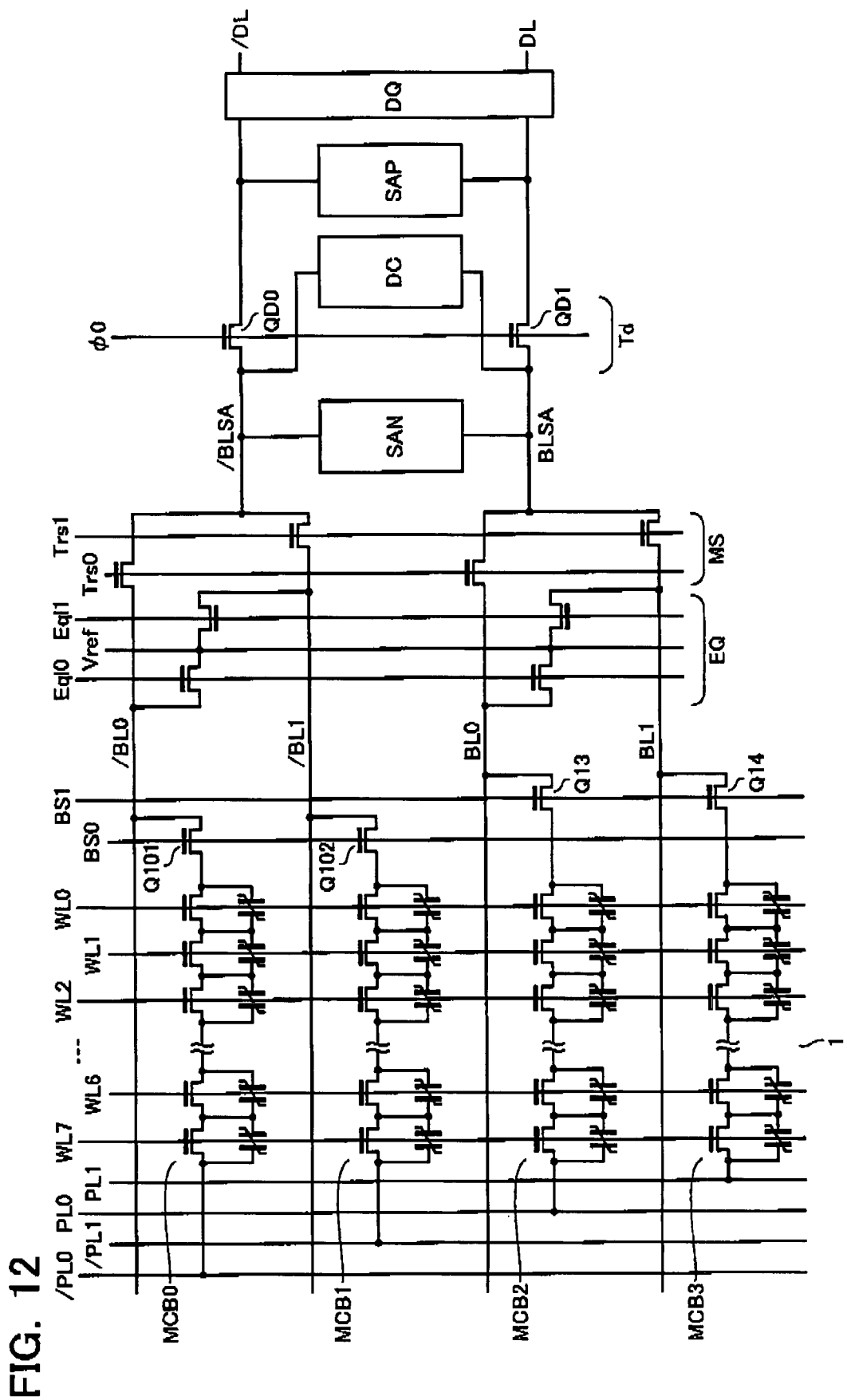
FIG. 12 shows a circuit diagram of a ferroelectric memory according to an eighth embodiment of the present invention.

FIG. 12 shows a configuration of a ferroelectric capacitor according to an eighth embodiment of the present invention. Also in this embodiment, the two bit lines /BL0 and /BL1 (BL0 and BL1) are connectable to the one bit line /BLSA (BLSA), and one of them is selectable by the multiplexer circuit MS. This embodiment is similar to the fifth embodiment except that the sense amplifiers SAP and SAN, the dummy cell DC, and the data-line control circuit DQ are arranged in an order similar to those in the fourth embodiment.

Ninth Embodiment

Figure 13:
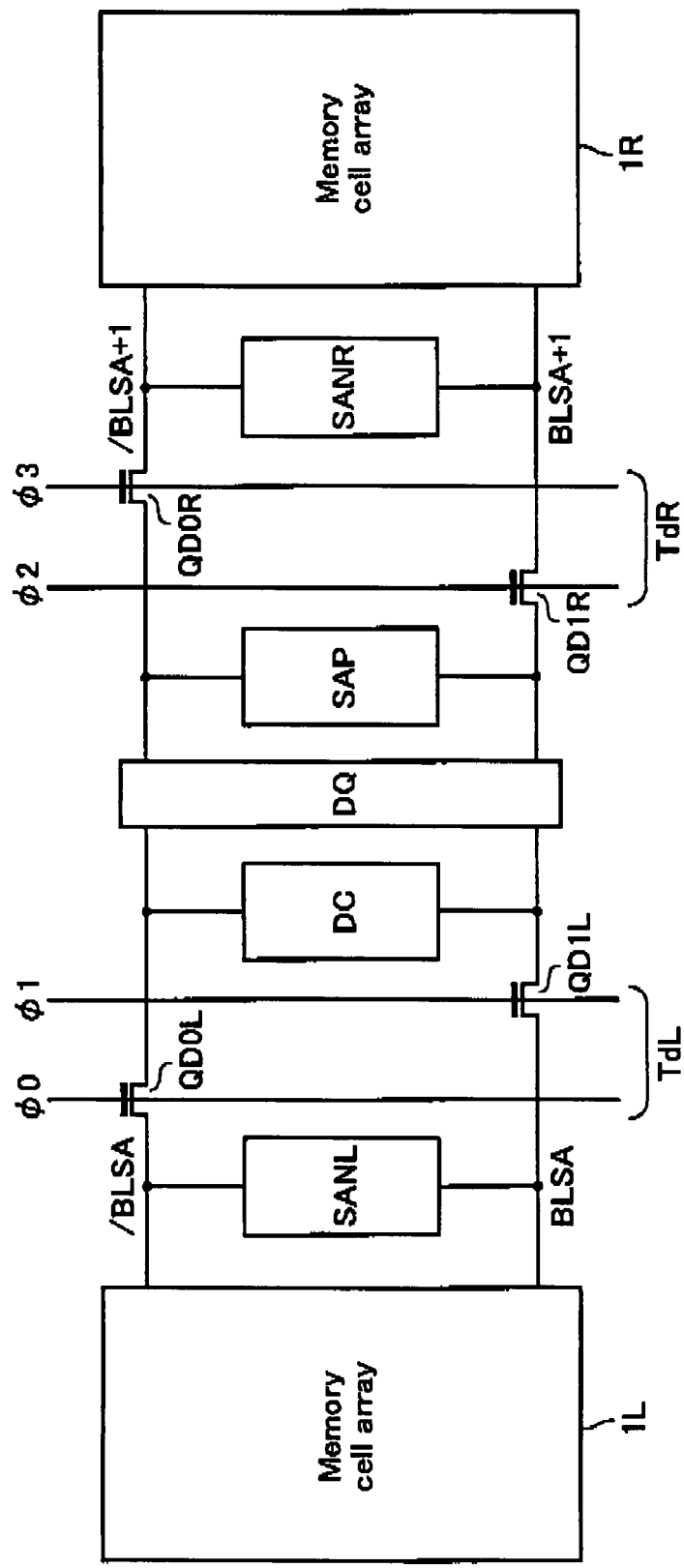
FIG. 13 shows a circuit diagram of a ferroelectric memory according to a ninth embodiment of the present invention.

FIG. 13 shows a configuration of a ferroelectric capacitor according to a ninth embodiment of the present invention. This embodiment differs from the above embodiments in that it adopts the shared sense-amplifier scheme where the p-type sense amplifier SAP is shared by two memory cell arrays 1L and 1R.

From the left-side memory cell array 1L, the bit lines /BLSA and BLSA extend. In their extensions, a left-side decoupling circuit TdL is provided. The left-side decoupling circuit TdL includes in the bit lines /BLSA and BLSA decoupling transistors QD0L and QD1L, respectively. The decoupling transistors QD0L and QD1L are turned on/off by the gate signals φ0 and φ1. The left-side decoupling circuit TdL and the memory cell array 1L have between them a left-side n-type sense amplifier SANL.

Similarly, from the right-side memory cell array 1R, the bit lines /BLSA+1 and BLSA+1 extend. In their extensions, a right-side decoupling circuit TdR is provided. The right-side decoupling circuit TdR includes in the bit lines /BLSA+1 and BLSA+1 decoupling transistors QD0R and QD1R, respectively. The decoupling transistors QD0R and QD1R are turned on/off by gate signals φ2 and φ3. The right-side decoupling circuit TdR and the memory cell array 1R have between them a right-side n-type sense amplifier SANR.

Figure 14:
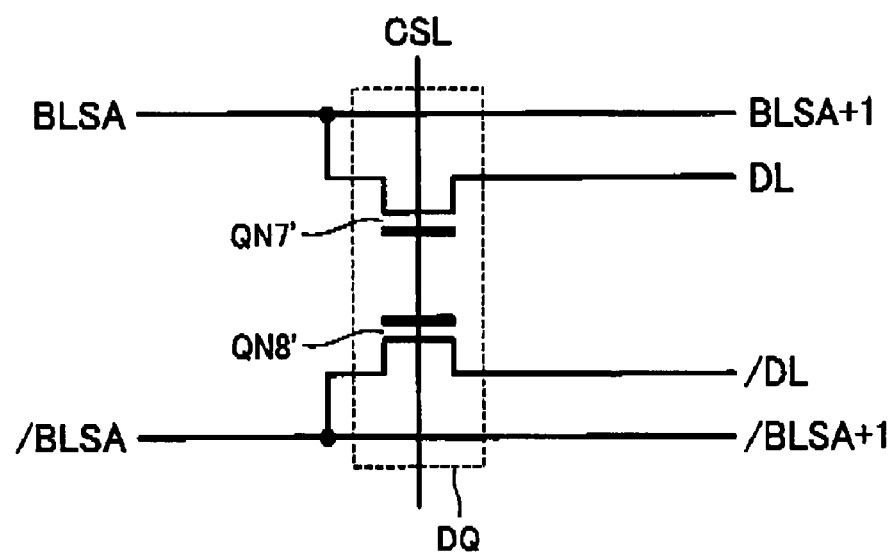
FIG. 14 shows a specific configuration of the data-line control circuit DQ in FIG. 13.

The bit lines between the left and right decoupling circuits TdL and TdR have thereon the dummy capacitor DC and the p-type sense amplifier SAP as in the above embodiment, and additionally a data-line control circuit DQ as shown in FIG. 14. The data-line control circuit DQ includes n-type MOS transistors QN7' and QN8'. The QN7' has one end connected to the bit lines BLSA and BLSA+1. The QN8' has one end connected to the /BLSA and /BLSA+1. The transistors QN7' and QNB' have the other ends connected to the data lines DL and /DL, respectively. The transistors QN7' and QN8' have their gates receiving a control signal CSL.

Figure 15:
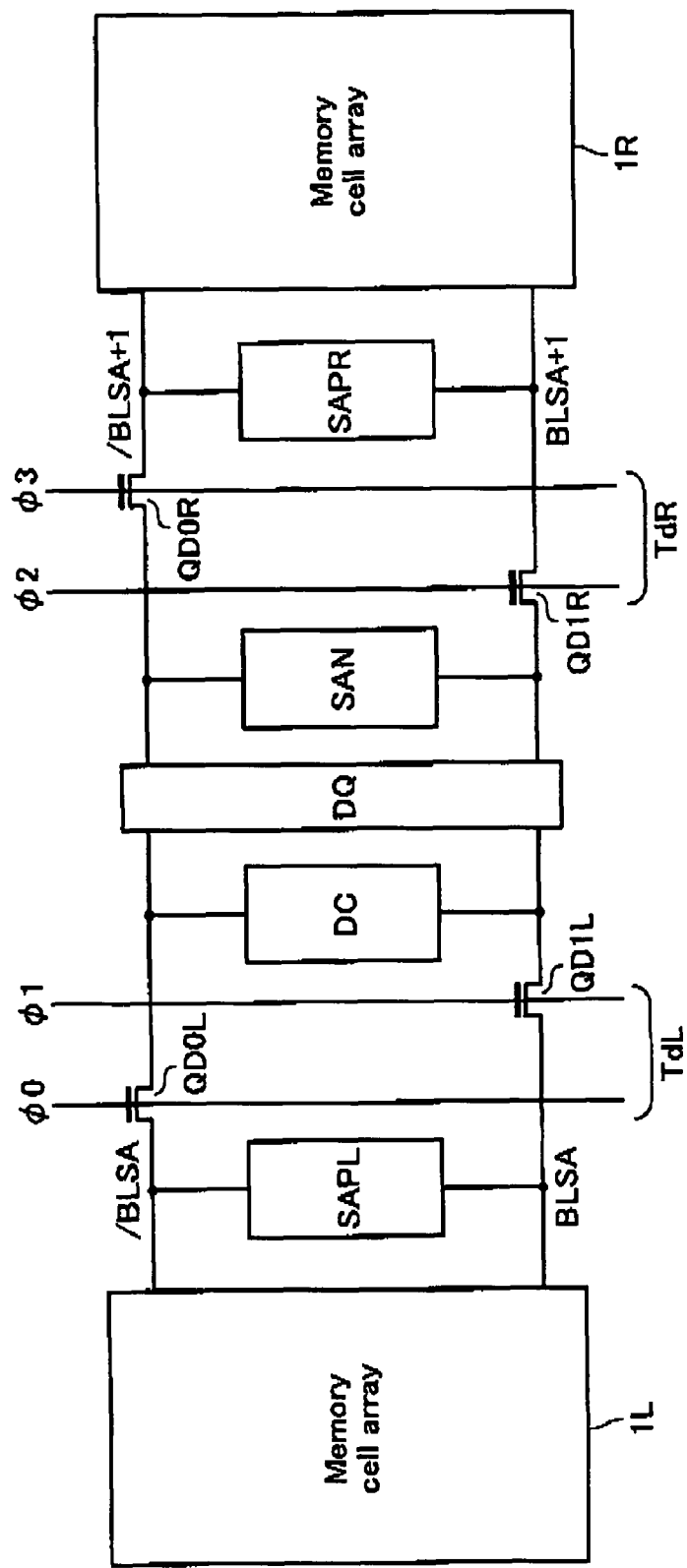
FIG. 15 shows a modified example of a circuit diagram of a ferroelectric memory according to the ninth embodiment of the present invention.

In this embodiment, the decoupling circuit TdR (TdL) and the memory cell array 1R (1L) have between them the n-type sense amplifier SANR (SANL), and the dummy cell DC resides between the data-line control circuit DQ and the decoupling circuit TdL. Data may be read from the right-side memory cell array 1R, for example, in a way similar to that in the third embodiment (FIG. 6). It will be appreciated that referring to FIG. 15, the p-type sense amplifier SAP (SAPL and SAPR) may be replaced with the n-type sense amplifier SAN.

Thus, although the invention has been described with respect to particular embodiments thereof, it is not limited to those embodiments. It will be understood that various modifications, additions, substitutions, deletions and the like may be made without departing from the spirit of the present invention. Although, for example, the above embodiments have primarily been described with respect to the chain-type FeRAM, the invention is not limited thereto, and the invention may be applied to general ferroelectric memories including the ferroelectric capacitor and the transistor.

What is claimed is:

1. A semiconductor memory device comprising:
   a memory cell array with memory cells arranged therein the memory cell including a ferroelectric capacitor and a transistor,
   a word line selecting the memory cell,
   a plate line applying a drive voltage to the ferroelectric capacitor, and
   a bit line reading data from the ferroelectric capacitor in the memory cell,
   a selection transistor selectively connecting the bit line to the memory cell;
   a dummy cell providing a reference potential to another bit line forming a bit-line pair with the bit line, the reference potential being referred to for a potential read from the memory cell;
   a sense amplifier circuit comprising a plurality of amplification circuits amplifying a potential difference between the bit-line pair; and
   a decoupling circuit electrically cutting off the bit line between the amplification circuits.

2. The semiconductor memory device according to claim 1, wherein
   the decoupling circuit comprises a first transistor connected to one bit line of the bit-line pair, the transistor being rendered conductive by a first control signal, and a second transistor being connected to the other bit line of the bit-line pair, the transistor being rendered conductive by a second control signal.

3. The semiconductor memory device according to claim 2, wherein
   one of the first and second transistors that is connected to the bit line to which data is read from the memory cell is rendered conductive later than the other.

4. The semiconductor memory device according to claim 3, wherein
   the decoupling circuit resides between the dummy cell and the memory cell array.

5. The semiconductor memory device according to claim 2, the first and second transistors are rendered conductive at a same time by a same control signal.

6. The semiconductor memory device according to claim 5, wherein
   the dummy cell resides between the memory cell array and the decoupling circuit.

7. The semiconductor memory device according to claim 1, wherein
   the amplification circuits comprise a first amplification circuit between the memory cell array and the decoupling circuit, and a second amplification circuit on an opposite side of the first amplification circuit sandwiching the decoupling circuit therebetween,
   the first amplification circuit being activated later than the second amplification circuit.

8. The semiconductor memory device according to claim 7, wherein
   the decoupling circuit comprises a first transistor connected to one bit line of the bit-line pair, the first transistor being rendered conductive by a first control signal, and a second transistor being connected to the other bit line of the bit-line pair, the second transistor being rendered conductive by a second control signal.

9. The semiconductor memory device according to claim 8, wherein
   one of the first and second transistors that is connected to the bit line to which data is read from the memory cell is rendered conductive later than the other.

10. The semiconductor memory device according to claim 9, wherein
    the decoupling circuit resides between the dummy cell and the memory cell array.

11. The semiconductor memory device according to claim 8, wherein
    the first and second transistors are rendered conductive at a same time by a same control signal.

12. The semiconductor memory device according to claim 11, wherein
    the dummy cell resides between the memory cell array and the decoupling circuit.

13. The semiconductor memory device according to claim 1, wherein
    the amplification circuits comprise
    a p-type sense amplifier comprising two p-type MOS transistors connected in series between the bit-line pair, the two p-type MOS transistors having their gates cross-connected to the bit-line pair, and
    a n-type sense amplifier comprising two n-type MOS transistors connected in series between the bit-line pair, the two n-type MOS transistors having their gates cross-connected to the bit-line pair.

14. The semiconductor memory device according to claim 1, wherein
    the decoupling circuit comprises a first transistor connected to one bit line of the bit-line pair, the first transistor being rendered conductive by a first control signal, and a second transistor being connected to the other bit line of the bit-line pair, the second transistor being rendered conductive by a second control signal, and wherein
    one of the first and second transistors that is connected to the bit line to which data is read from the memory cell is rendered non-conductive until a portion of the amplification circuits ends amplification.

15. The semiconductor memory device according to claim 1, further comprising
    a multiplexer circuit selectively connecting the bit lines to the sense amplifier circuit, and
    an equalizer circuit equalizing potentials of the bit lines before the potentials of the bit lines are read.

16. The semiconductor memory device according to claim 1, wherein
    the amplification circuits comprise a first amplification circuit between the memory cell array and the decoupling circuit, and a second amplification circuit on a side of the decoupling circuit opposite the first amplification circuit,
    the second amplification circuit being shared by the memory cell arrays.

* * * * *